(12) United States Patent
Guan et al.

(10) Patent No.: US 10,916,878 B2
(45) Date of Patent: Feb. 9, 2021

(54) UNITARY MOLDED USB DEVICE

(71) Applicant: Western Digital Technologies, Inc., San Jose, CA (US)

(72) Inventors: Tee Khoon Guan, Penang (MY); Pradeep Kumar Rai, Pulau Pinang (MY)

(73) Assignee: Western Digital Technologies, Inc., San Jose, CA (US)

( * ) Notice: Subject to any disclaimer, the term of this patent is extended or adjusted under 35 U.S.C. 154(b) by 372 days.

(21) Appl. No.: 16/016,233

(22) Filed: Jun. 22, 2018

(65) Prior Publication Data
US 2019/0393654 A1 Dec. 26, 2019

(51) Int. Cl.
| | | |
|---|---|---|
| H01R 13/504 | (2006.01) |
| H01R 13/66 | (2006.01) |
| H01L 21/56 | (2006.01) |
| H01L 25/065 | (2006.01) |
| H01L 23/31 | (2006.01) |
| H01R 43/24 | (2006.01) |
| H01R 39/16 | (2006.01) |
| H01R 13/405 | (2006.01) |

(52) U.S. Cl.
CPC .......... *H01R 13/504* (2013.01); *H01L 21/56* (2013.01); *H01L 21/565* (2013.01); *H01L 23/3107* (2013.01); *H01L 25/0652* (2013.01); *H01R 13/405* (2013.01); *H01R 13/665* (2013.01); *H01R 39/16* (2013.01); *H01R 43/24* (2013.01)

(58) Field of Classification Search
CPC .................................................... H01R 13/504
See application file for complete search history.

(56) References Cited

U.S. PATENT DOCUMENTS

| 6,779,260 | B1* | 8/2004 | Brandenburg | ...... H01L 23/3121 |
| | | | | 174/541 |
| 7,259,967 | B2 | 8/2007 | Ni | |
| 7,296,345 | B1* | 11/2007 | Wang | .................. B29C 45/1671 |
| | | | | 29/832 |
| 7,364,458 | B1* | 4/2008 | Ju | ...................... H01R 13/2414 |
| | | | | 439/524 |
| 8,670,243 | B2* | 3/2014 | Mitsuhashi | ............ H05K 1/117 |
| | | | | 361/752 |
| 8,986,050 | B2 | 3/2015 | King et al. | |
| 2002/0140068 | A1* | 10/2002 | Lee | ...................... H01L 23/3107 |
| | | | | 257/676 |
| 2005/0164532 | A1* | 7/2005 | Ni | ..................... G06K 19/07732 |
| | | | | 439/79 |
| 2007/0066139 | A1* | 3/2007 | Roeper | .................... H01L 25/16 |
| | | | | 439/607.01 |
| 2008/0280466 | A1 | 11/2008 | Sitz et al. | |
| 2010/0248505 | A1* | 9/2010 | Kim | ........................ H01R 43/24 |
| | | | | 439/78 |
| 2014/0098483 | A1* | 4/2014 | Miller | ...................... H05K 1/00 |
| | | | | 361/679.32 |
| 2019/0393654 | A1* | 12/2019 | Guan | .................. H01L 23/3107 |

FOREIGN PATENT DOCUMENTS

| TW | 200930181 A | 7/2009 |
| TW | 201610693 A | 3/2016 |

* cited by examiner

*Primary Examiner* — James Harvey
(74) *Attorney, Agent, or Firm* — Vierra Magen Marcus LLP

(57) ABSTRACT

A USB device, and methods of forming same, are disclosed. The USB device includes a semiconductor device such as a SIP module and a housing injection molded around the semiconductor device.

18 Claims, 9 Drawing Sheets

UNITARY MOLDED USB DEVICE

BACKGROUND OF THE INVENTION

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large storage capacity, have made such memory devices ideal for use in a wide variety of electronic devices, including for example digital cameras, digital music players, video game consoles, PDAs and cellular telephones.

Equally ubiquitous is the universal serial bus (USB) interface for transferring signals between devices such as those named above and other components such as for example desktop computers and the like. A typical USB storage device includes a memory device such as a system in a package (SIP) coupled to a USB connector capable of mating within a USB slot of a host device. The SIP module typically includes a printed circuit board on which are mounted one or more flash memory chips, a controller, passive components and at times an LED for indicating when the memory is being accessed.

Conventionally, a USB storage device is fabricated by manually inserting each SIP module or other memory device into a housing. This housing may often comprise an inner plastic housing covering a back end of the memory device and a metal housing covering a front end of the memory device. These manual assembly steps reduce throughput and increase operating costs.

DETAILED DESCRIPTION

Embodiments will now be described with reference to the figures, which relate to a unitary molded USB device. The USB device may include a memory device such as a SIP module molded into a protective housing. Multiple memory devices may be molded together in a panel and then singulated to achieve economies of scale. It is understood that the present technology may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a given dimension.

Figure 1:
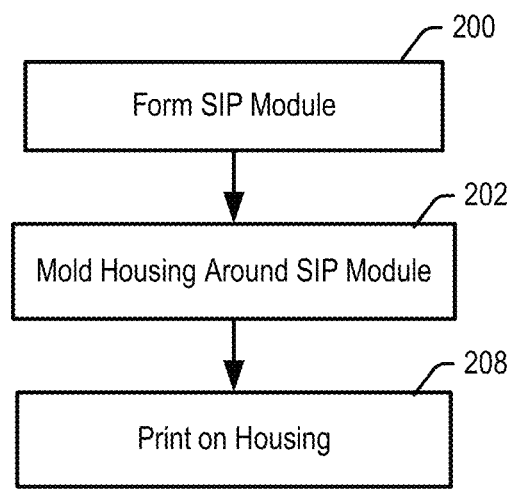
FIG. 1 is a flowchart of a fabrication process for a USB device according to embodiments of the present technology.
Figure 2:
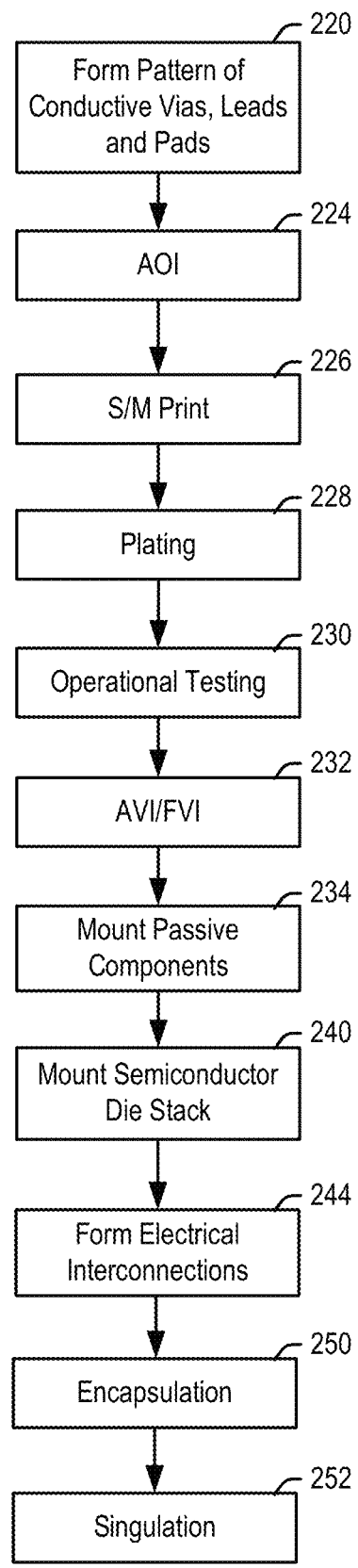
FIG. 2 is a flowchart of the fabrication process of semiconductor device according to embodiments of the present invention.

An embodiment of the present technology will now be explained with reference to the flowchart of FIGS. 1 and 2 and the views of FIGS. 3 through 12. Referring initially to the flowchart of FIG. 1, a memory device such as a SIP module may be formed in step 200. Further details of step 200 are shown in the flowchart of FIG. 2, and the top and bottom views of FIGS. 3 and 4 which show a SIP module 100. The SIP module 100 may be batch processed along with a plurality of other modules 100 on a substrate panel to achieve economies of scale. The number of rows and columns of modules 100 on the substrate panel may vary.

Figure 3:
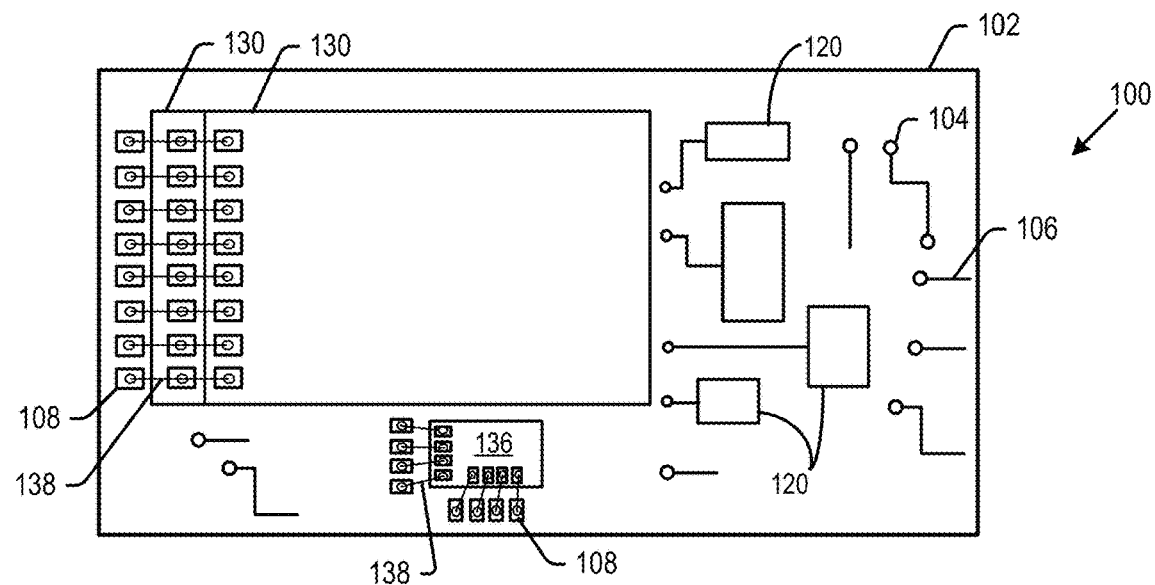
FIG. 3 is a top view of a semiconductor device during fabrication according to embodiments of the present technology.
Figure 4:
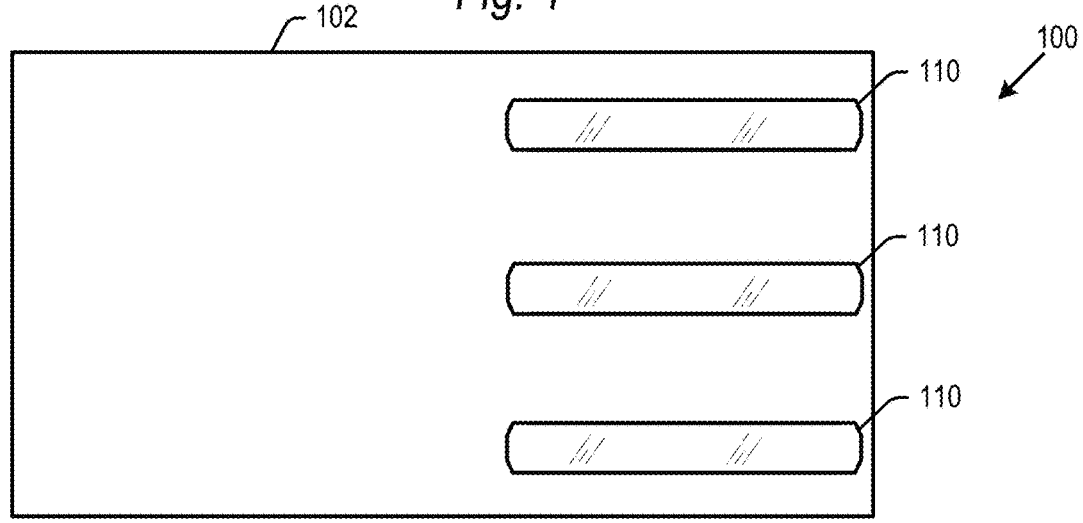
FIG. 4 is a bottom view of a semiconductor device according to embodiments of the present technology.
Figure 5:
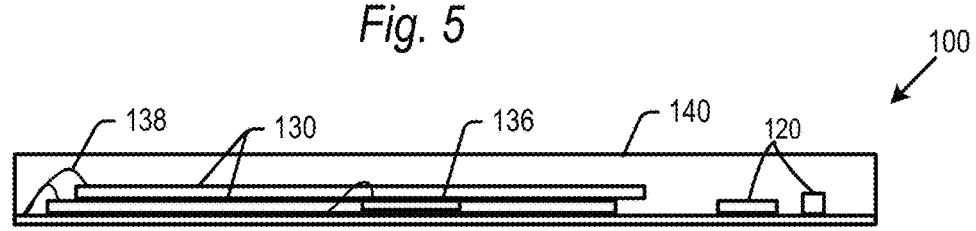
FIG. 5 is an edge view of a semiconductor device according to embodiments of the present technology.

The substrate panel begins with a plurality of substrates 102 (again, one such substrate is shown in FIGS. 3 and 4). The substrate 102 may be a variety of different chip carrier mediums, including a printed circuit board (PCB), a leadframe or a tape automated bonded (TAB) tape. Where substrate 102 is a PCB, the substrate may be formed of a core having a top conductive layer and a bottom conductive layer. The core may be formed of various dielectric materials such as for example, polyimide laminates, epoxy resins including FR4 and FR5, bismaleimide triazine (BT), and the like. The conductive layers surrounding the core may be formed of copper or copper alloys, plated copper or plated copper alloys, copper plated steel, or other metals and materials known for use on substrate panels.

In a step 220, a conductive pattern of vias, leads and pads are formed in and through the substrate 102. The substrate 102 may drilled to define through-hole vias 104, which are subsequently plated and/or filled with a conductive metal. A conductance pattern of electrical traces 106 and contact pads 108 may then be formed. The vias, 104, traces 106 and contact pads 108 shown are by way of example, and the substrate 102 may include more vias, traces and/or contact pads than is shown in the figures, and they may be in different locations than is shown in the figures. The conductance pattern on the top and/or bottom surfaces of the substrate 102 may be formed by a variety of known processes, including for example various photolithographic processes.

The SIP module 100 further includes a USB connector which, in embodiments, may be formed on a lower surface of the substrate 102. Accordingly, in embodiments, the conductance pattern may also define connector pins 110 as shown in the bottom view of FIG. 4. Alternatively, it is understood that connector pins 110 may be formed independently of substrate 102 and mounted on substrate 102 thereafter. The USB device including SIP module 100 may be configured to operate according to any of a variety of USB standards, which may dictate the number and positions of pins 110. In further embodiments, pins 110 may be provided on both surfaces of the substrate 102.

Referring again to FIG. 2, the substrate 102 may next be inspected in step 224. This step may include an automatic optical inspection (AOI). Once inspected, a solder mask may be applied to the substrate in step 226. After the solder mask is applied, the contact pads, and any other areas to be soldered on the conductance patterns may be plated, for example, with a Ni/Au, Alloy 42, or the like, in step 238 in a known electroplating or thin film deposition process. The substrate 102 may then undergo operational testing in step 230. In step 232, the substrate may be visually inspected, including for example an automated visual inspection (AVI) and a final visual inspection (FVI) to check for contamination, scratches and discoloration. One or more of these steps may be omitted or performed in a different order.

Assuming the substrate 102 passes inspection, passive components 120 may next be affixed to the top surface of the substrate 102 in a step 234 as shown in FIG. 3. The one or more passive components 120 may be mounted on the substrate 102 and electrically coupled to the conductance pattern as by connection to contact pads (not shown) in known surface mount and reflow processes. The passive components 120 may include for example one or more capacitors, resistors and/or inductors, though other components are contemplated. An LED may also be mounted to the substrate and permanently affixed during a reflow process. The LED may activate when the below-described flash memory is accessed during use of the USB flash memory device.

Referring to the top view of FIG. 3, one or more semiconductor die may next be affixed to the top surface of the substrate 102 in a step 240. The embodiment of FIG. 3 includes a flash memory die 130 and a controller die 136. The memory die 130 may be for example flash memory chips, such as 2D NOR or NAND semiconductor die or 3D BiCS (Bit Cost Scaling) semiconductor die, though other types of memory die are contemplated. Controller die 136 may for example be an ASIC. FIG. 3 shows a pair of memory die 130 and a controller die mounted on the substrate 102. However, the number of memory die and the location of the controller die may vary in further embodiments.

After the die 130, 136 have been mounted on the substrate, the die may be electrically coupled to the substrate, for example via wire bonds 138 in step 244. It is understood that the die 130 and/or die 136 may be mounted to the substrate by other electrical interconnections, including for example through-silicon vias.

In embodiments, after the die 130, 136 are coupled to substrate 102, the substrate and die may be encapsulated in a molding compound 140 (FIG. 5) in step 250 to form the completed SIP module 100. Although not critical to the present invention, the molding compound 140 may be an epoxy resin such as for example available from Sumito Corp. or Nitto Denko Corp., both having headquarters in Japan. Other molding compounds from other manufacturers are contemplated. The molding compound may be applied according to various processes, including by FFT (flow free thin) molding, transfer molding or injection molding techniques. In embodiments, the encapsulated SIP module 100 may have a thickness of less than 1 mm.

Figure 6:
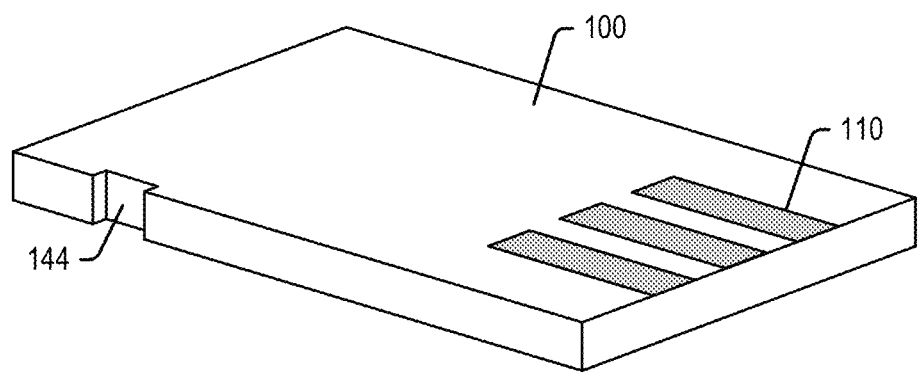
FIG. 6 is a perspective view of a semiconductor device according to embodiments of the present technology.

The connector pins 110 may be left uncovered and exposed so that they may be mated with terminals in a host device. Additionally, as seen in FIG. 6, a notch 144 may be formed in the molding compound 140. The notch is used to lock the SIP module within a molded housing as explained below. While the above description relates to the formation of a SIP module, it is understood that semiconductor devices and data storage devices other than SIP modules may be encased within the housing in further embodiments of the present technology.

As noted, the SIP module 100 may be fabricated on a panel containing several SIP modules 100 for economies of scale. After the SIP modules 100 on the panel have been encapsulated in step 250, the respective devices may be singulated in step 252 from the panel to form the finished SIP module 100 shown in the edge and perspective views of FIGS. 5 and 6. Each module 100 may be singulated by any of a variety of cutting methods including sawing, water jet cutting, laser cutting, water guided laser cutting, dry media cutting, and diamond coating wire cutting. While straight line cuts will define generally rectangular or square shaped modules 100, it is understood that module 100 may have shapes other than rectangular and square in further embodiments of the present invention.

Figure 7:
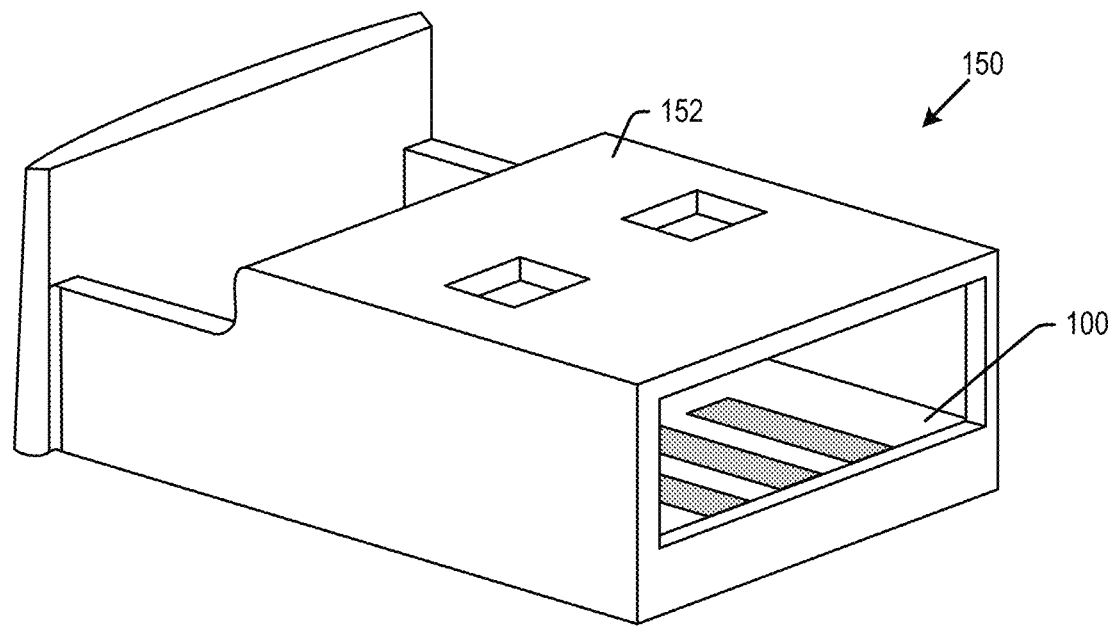
FIG. 7 is a perspective view of a USB device comprising a semiconductor device encased within a housing according to embodiments of the present technology.
Figure 8:
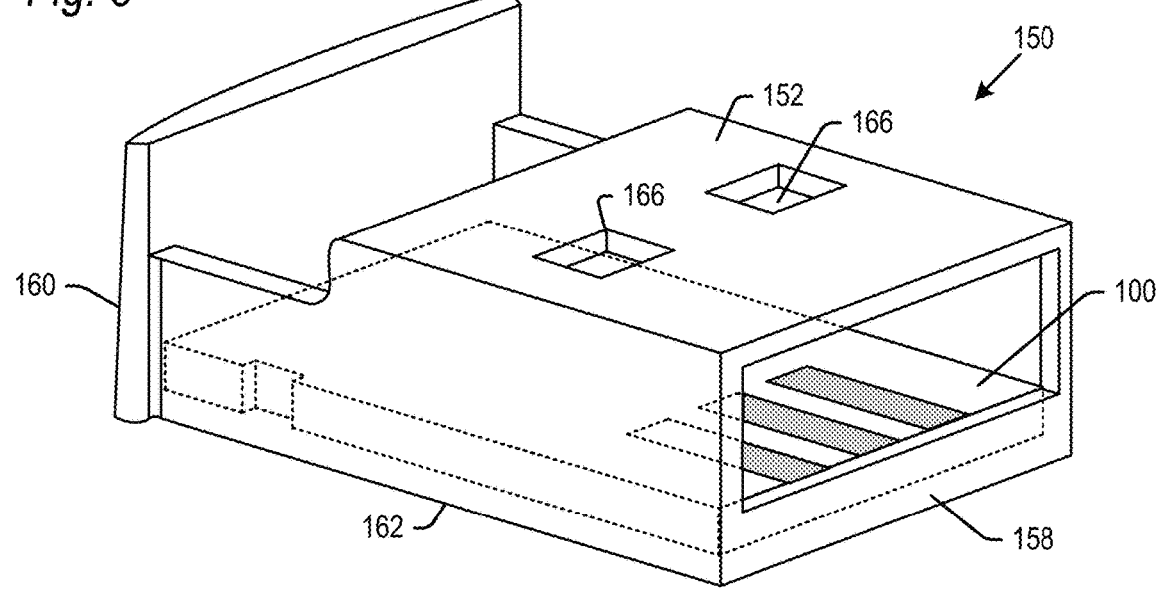
FIG. 8 is a perspective view of a USB device comprising a semiconductor device, shown in phantom, encased within a housing according to embodiments of the present technology.
Figure 9:
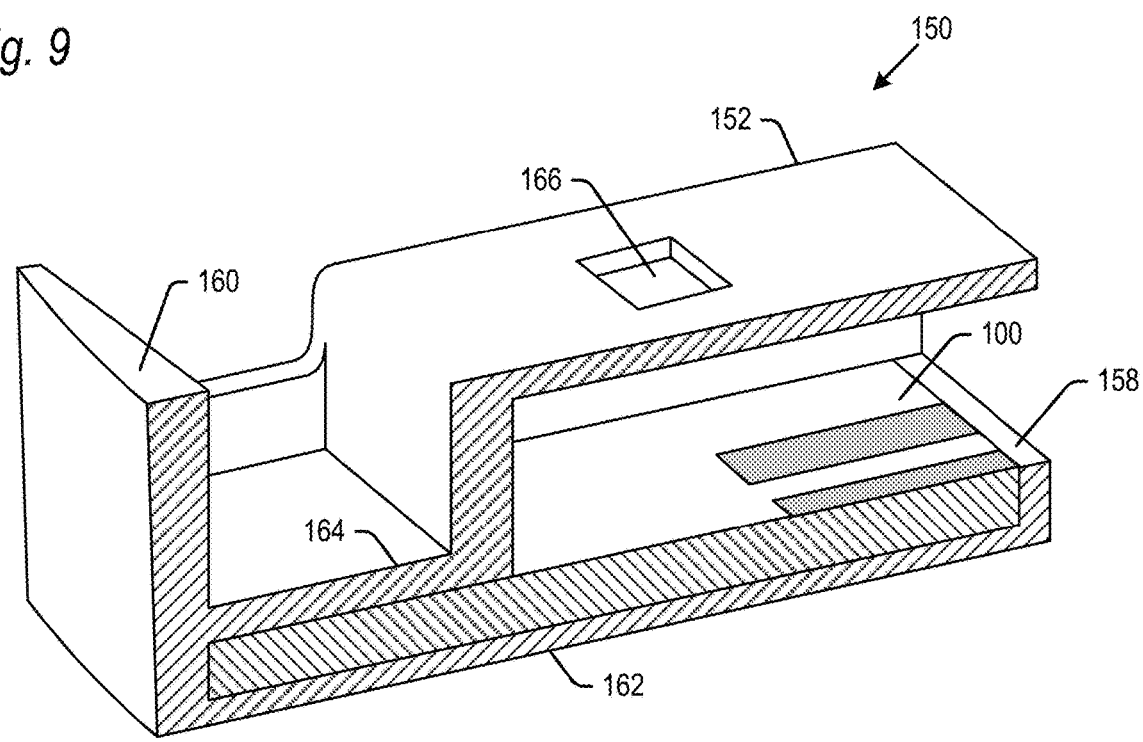
FIG. 9 is a cross-sectional edge view of a USB device comprising a semiconductor device encased within a housing according to embodiments of the present technology.

Referring again to FIG. 1, after the SIP module 100 is formed in step 200, the SIP module 100 may be encased in a housing in step 202 to form a completed USB device. FIGS. 7, 8 and 9 show perspective, phantom perspective and cross-sectional views, respectively, of a completed USB device 150 including a SIP module encased within a housing 152. As shown, the molded housing 152 engages the SIP module at a plurality of points so as to fix the SIP module 100 within the housing 152. For example, when injected as a liquid, the molding compound will flow into and fill the notch 144. When the molding compound cures, this engagement will secure the SIP module 100 with the housing 150. Additionally, as seen for example in FIGS. 8 and 9, the housing 152 includes a front lip 158 and back wall 160 which sandwich the SIP module 100 front to back, and a base 162 and top-engaging surface 164 which sandwich the SIP module 100 top to bottom.

In addition to locking the SIP module 100 within the housing, the back wall 160 provides a convenient finger grip, enabling the USB device 150 to be easily inserted into and removed from a host device USB slot. The front lip 158 may also protect the SIP module 100 against damage when the USB device 150 is inserted into a host device USB slot. At least some USB standards define a pair of recesses formed in the upper and/or lower surfaces of USB devices. Such recesses 166 may be formed in the housing 152 per the applicable USB standards when the housing 152 is formed.

In embodiments, the housing 152 may be injection molded around the SIP module 100. As shown schematically in FIG. 10, the SIP module 100 may be seated within a mold comprising upper mold plate 170 and lower mold plate 172, which come together around the SIP module when the mold is sealed. The mold plates 170, 172 together may define a mold cavity including contours and features in the shape of the finished housing 152. Any of various thermoplastic resins or thermosetting polymers may be used for the housing 152, such as for example polycarbonate, or a polycarbonate—acrylonitrile butadiene styrene polymer (PC-ABS) blend. Other materials may be used in further embodiments.

The molding compound may be injected into the mold including the SIP module in liquid form under pressure so that the molding compound fills all spaces around the SIP module 100 within the mold. The molding compound then hardens into housing 152 and it may be removed from the mold. While a particular configuration of housing 152 is shown in the figures, it is understood that housing 152 may have other appearances in further embodiments, while maintaining the functionality and features described herein.

Figure 10:
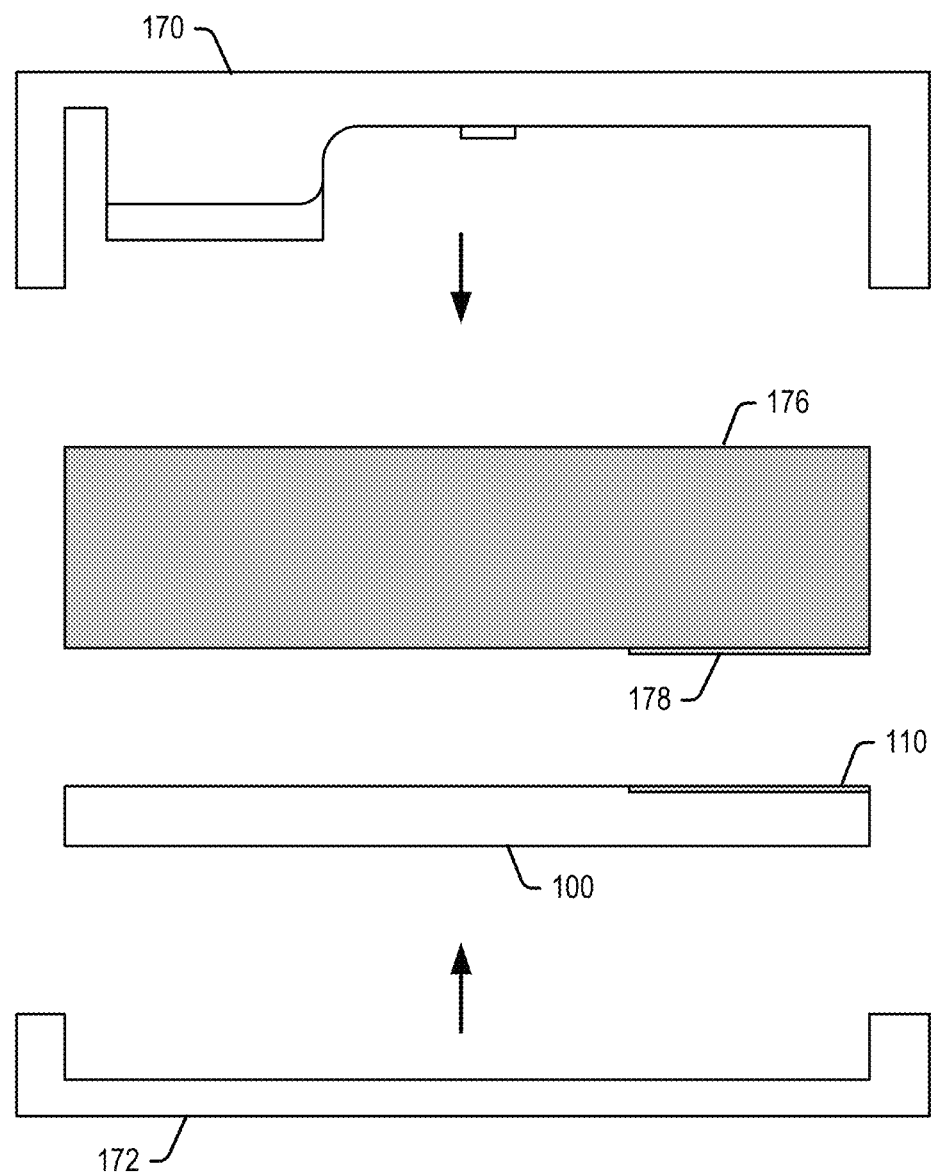
FIG. 10 is an exploded edge view of a mold for encasing a semiconductor device according to an embodiment of the present technology.
Figure 11:
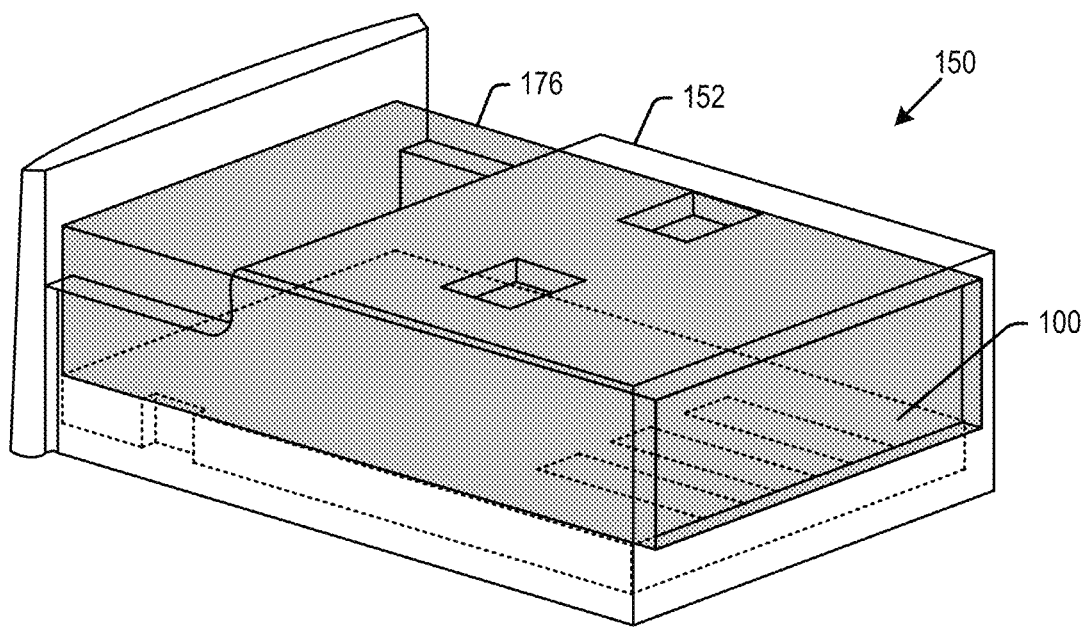
FIG. 11 is a perspective view of a USB device including an encased semiconductor die and a blank.

USB devices include a space above the connector pins for mating with a block of pins in a host device USB slot. In order to provide this space in USB device 150, a blank 176 may also be provided within the mold, on the surface of the SIP module 100, as shown in FIGS. 10 and 11. It is possible that the pins 110 on SIP module 100 may be recessed into the surface of the SIP module 100. In order to ensure that none of the liquid molding compound migrates onto the pins 110 during the injection molding process, the blank may include a pattern of block pins 178 matching the pattern and shape of USB pins 110. During the molding process, the block pins 178 seat down on top of the USB pins 110 to keep them clear of the molding compound. The blank 176 may be removed to define a hollow space above the SIP module 100 once the molding compound hardens and the USB device is removed from the mold. In further embodiments, the blank 176 may be part of the mold.

Referring again to FIG. 1, once the USB device 150 is formed including the molded housing 152, the housing 152 may be printed with a logo, print or other graphics in step 208. In some embodiments, it may be desirable to have an external electrical connector on at least portions of housing 152, for example for grounding and electrostatic discharge. In such embodiments, a metal or other electrical conductor can be applied over portions of the USB device 150. Such an electrical conductor may be applied by thin film deposition techniques such as physical vapor deposition. If such an electrical conductor is applied, it may be applied before or after the step 208 of printing the housing.

In embodiments, the USB devices 150 may be fabricated individually. Such embodiments offer improvements over conventional USB fabrication processes by reducing the number of processing steps and improving processing speed and throughput. In further embodiments of the present technology, the USB devices 150 may be fabricated on a panel of multiple USB devices 150. This embodiments offers even greater improvements over conventional USB fabrication processes by providing economies of scale in addition to reducing processing steps.

Figure 12:
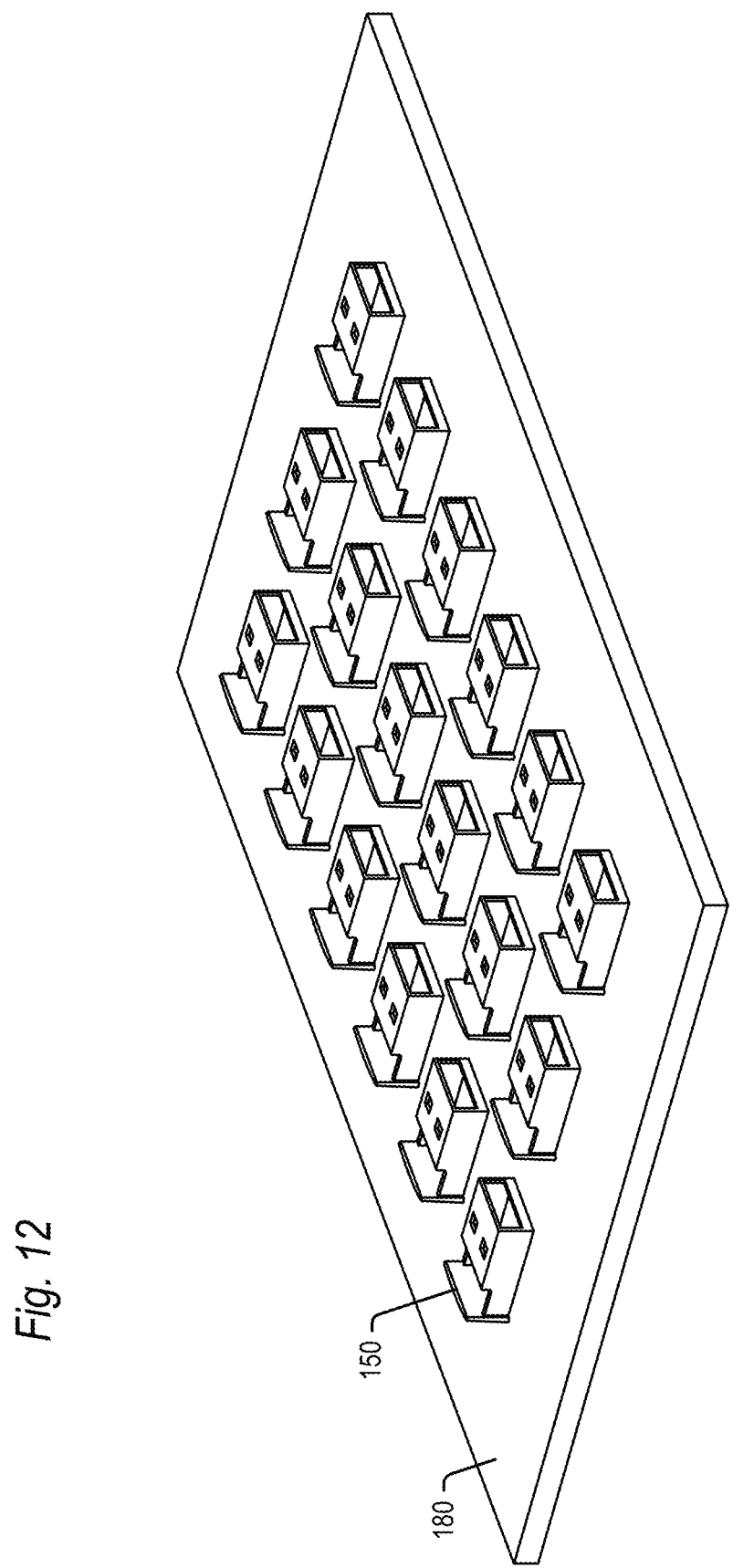
FIG. 12 is a perspective view of a plurality of USB devices being fabricated on a panel.

An embodiment where multiple USB devices 150 are fabricated on a panel 198 is shown in FIG. 12. The mold including plates 170 and 172 may include cavities for multiple USB devices 150. Multiple SIP modules 100 may be placed in their respective cavities, and then all are injection molded with housings 152 together. Once removed from the mold, individual USB devices 150 may be cut or otherwise separated from the panel 180.

Figure 13:
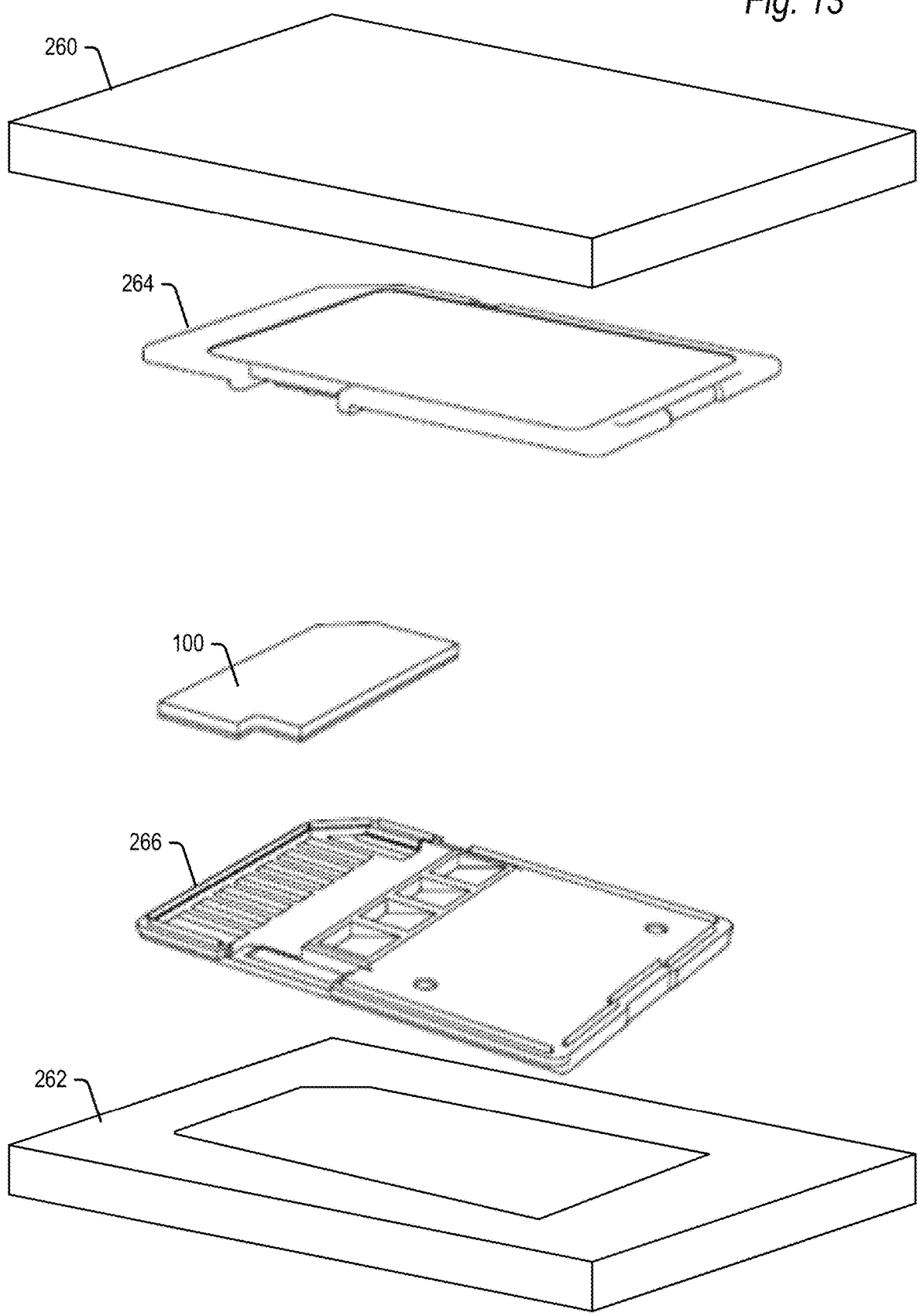
FIG. 13 is an exploded perspective view of a further embodiment of the present technology where a SIP module is encased in a molded top lid and bottom lid to form a semiconductor device according to the SD card standard.

In the embodiments described above, SIP module 100 is encased within a housing configured according to the USB standard. It is understood that a SIP module 100 may be encased within a housing configured according to other standards. For example, FIG. 13 is an exploded perspective view showing a SIP module 100 which may be placed in a mold including upper and lower mold plates 260, 262. The mold plates may be closed together, and any of various thermoplastic resins or thermosetting polymers (such as those mentioned above) may then be injected into the mold. The injected material may then harden to form the upper lid 264 and lower lid 266. In this embodiment, the upper and lower lids 264, 266 together conform to the SD card standard. In this embodiment, the SIP 100 may be formed with a shape and with contact pads conforming to the SIP used in an SD card. It is understood that semiconductor devices conforming to other standards may similarly be formed by molding housings around other SIP modules.

In summary, an embodiment of the present technology relates to a USB device, including: a semiconductor device; a housing molded around the semiconductor device such that the semiconductor device is encased within the housing, the housing comprising a space above the semiconductor device configured to allow insertion of the USB device into a USB device host slot.

In another example, the present technology relates to a USB device, including: a semiconductor device comprising a plurality of connector pins; a housing injection molded around the semiconductor device, the housing engaging the semiconductor device at a plurality of points such that the semiconductor device is fixed within the housing, the housing comprising a space above the plurality of connector pins, the space configured to allow insertion of the USB device into a USB device host slot.

In a further example, the present technology relates to a method of fabricating USB devices, comprising: (a) placing a plurality of semiconductor devices in a mold; (b) encasing the plurality of semiconductor devices in a molding compound, the molding compound comprising a space above each of the plurality of semiconductor devices; and (c) separating the encased plurality of semiconductor devices into individual USB devices.

In another example, the present technology relates to a USB device, including: a semiconductor device means for storing data; housing means for encasing the semiconductor device such that the semiconductor device is encased within the housing, the housing means comprising a space above the semiconductor device configured to allow insertion of the USB device into a USB device host slot.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A USB device, including:
   a semiconductor device;

a housing flowed around a top and bottom of the semiconductor device to affix the semiconductor device within the USB device and to enclose the semiconductor device within the USB device, the housing comprising a space above the semiconductor device configured to allow insertion of the USB device into a USB device host slot.

2. A USB device as recited in claim 1, wherein the housing includes a lip and a back wall for restraining the semiconductor device in a first direction.

3. A USB device as recited in claim 2, wherein the housing includes a base and support surface for restraining the semiconductor device in a second direction orthogonal to the first direction.

4. A USB device as recited in claim 2, wherein the back wall is further configured to be gripped for inserting the USB device into the USB device host slot and for removing the USB device from the USB device host slot.

5. A USB device as recited in claim 1, wherein the semiconductor device includes a notch, and wherein the housing is engaged within the notch for restraining the semiconductor device within the housing.

6. A USB device as recited in claim 1, wherein the housing is formed of plastic.

7. A USB device as recited in claim 1, wherein the housing is formed of a polycarbonate-acrylonitrile butadiene styrene polymer blend.

8. A USB device as recited in claim 1, further comprising an electrical conductor applied to an outer surface of the housing.

9. A USB device, including:
a semiconductor device comprising a plurality of connector pins;
a housing injection molded around the semiconductor device, the housing engaging the semiconductor device at a plurality of points comprising lip and a back wall such that the semiconductor device is fixed within the housing, the housing comprising a space above the plurality of connector pins, the space configured to allow insertion of the USB device into a USB device host slot;
wherein the back wall is further configured to be gripped for inserting the USB device into the USB device host slot and for removing the USB device from the USB device host slot.

10. A USB device as recited in claim 9, wherein the plurality of points include a base and support surface for engaging the semiconductor device and restraining the semiconductor device in a second direction orthogonal to the first direction.

11. A USB device as recited in claim 9, wherein the semiconductor device includes a notch, and wherein the plurality of points comprise portions of the housing filling the notch to restrain the semiconductor device within the housing.

12. A USB device as recited in claim 9, wherein the semiconductor device comprises a system in a package.

13. A USB device as recited in claim 9, wherein the semiconductor device comprises a plurality of memory die.

14. A method of fabricating USB devices, comprising:
(a) placing a plurality of semiconductor devices in a mold;
(b) encasing a top and bottom of the plurality of semiconductor devices in a molten molding compound, the molten molding compound injected around the top and bottom of the plurality of semiconductor devices with a space above each of the plurality of semiconductor devices;
(c) curing the molten molding compound around the plurality of semiconductor devices; and
(d) separating the encased plurality of semiconductor devices into individual USB devices.

15. The method of claim 14, further comprising the step of applying an electrical conductor to an outer surface of the molding compound for electrically grounding the USB devices.

16. The method of claim 14, wherein said step (b) of encasing the plurality of semiconductor devices in a molding compound comprises the step of injecting the molding compound into the mold, around the plurality of semiconductor devices.

17. The method of claim 14, wherein said step (b) of encasing the plurality of semiconductor devices in a molding compound comprises the step of engaging the semiconductor device at a plurality of points such that the semiconductor device is fixed within the housing.

18. A USB device, including:
a semiconductor device means for storing data;
housing means for flowing around a top and bottom of the semiconductor device to affix and encase the semiconductor device within the housing means, the housing means comprising a space above the semiconductor device configured to allow insertion of the USB device into a USB device host slot.

* * * * *